United States Patent [19]
Nilsson

[11] Patent Number: 5,694,097
[45] Date of Patent: Dec. 2, 1997

[54] FORCE AND/OR MOTION GENERATING ARRANGEMENT

[75] Inventor: Kenth Åke Sune Nilsson, Åkersberga, Sweden

[73] Assignee: Oenico AB, Akersberga, Sweden

[21] Appl. No.: 556,969

[22] PCT Filed: Jun. 22, 1994

[86] PCT No.: PCT/SE94/00626

§ 371 Date: Dec. 8, 1995

§ 102(e) Date: Dec. 8, 1995

[87] PCT Pub. No.: WO95/00976

PCT Pub. Date: Jan. 5, 1995

[30] Foreign Application Priority Data

Jun. 22, 1993 [SE] Sweden ............... 9302164

[51] Int. Cl.[6] .................................. H01H 53/00
[52] U.S. Cl. .................. 335/4; 333/235; 333/24.1; 310/26
[58] Field of Search ............... 333/235, 202, 333/24.1, 215, 206, 207, 209, 219, 222.3, 227, 231, 4; 335/215, 296; 310/26

[56] References Cited

U.S. PATENT DOCUMENTS

| | | | |
|---|---|---|---|
| 4,651,116 | 3/1987 | Schloemann | 333/235 |
| 5,070,316 | 12/1991 | Engdahl et al. | 335/215 |

FOREIGN PATENT DOCUMENTS

| | | |
|---|---|---|
| 0364418 | 4/1990 | European Pat. Off. |
| 874659 | 8/1961 | United Kingdom . |

*Primary Examiner*—Lincoln Donovan
*Attorney, Agent, or Firm*—Keck, Mahin & Cate

[57] ABSTRACT

A force and/or motion generating arrangement comprises a body (16) of magnetostrictive material and means (10, 17) for feeding a magnetic flux through said body. Said means (10, 17) comprise a pair of opposite pole surfaces (14), which are located at a short distance from each other, said pole surfaces being connected to a source (17) of said magnetic flux and defining a gap (15) for receiving said body (16) therebetween and being arranged to feed the magnetic flux through said body (16) in a first direction (x), in which said body (16) has small dimensions in relation to its dimensions in at least one other direction (y), which is substantially perpendicular to said first direction and in which the body (16) may be brought to apply a force on and/or impart a motion to another object (19).

17 Claims, 1 Drawing Sheet

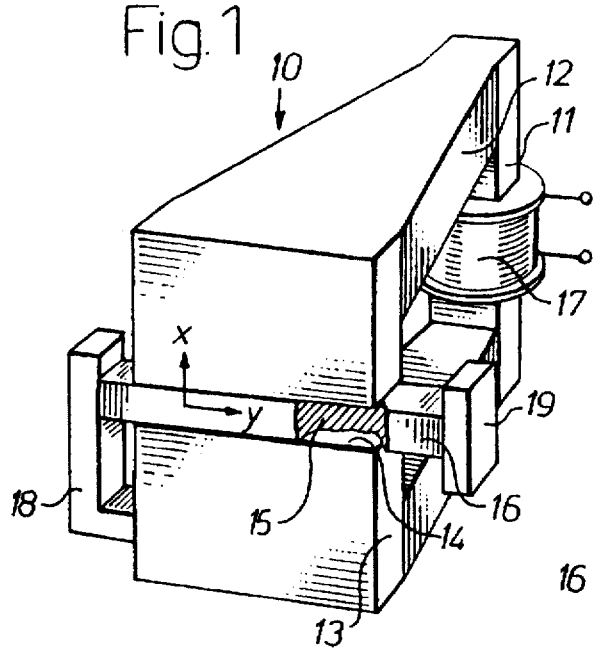
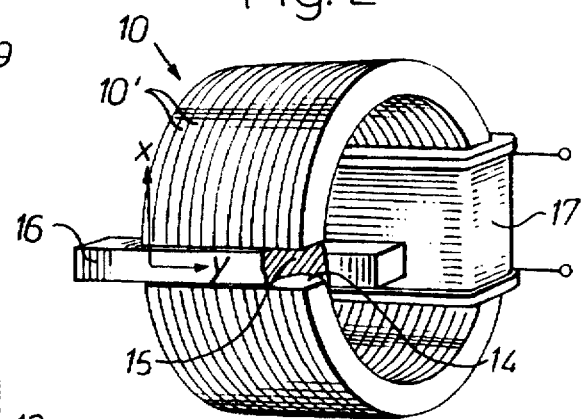
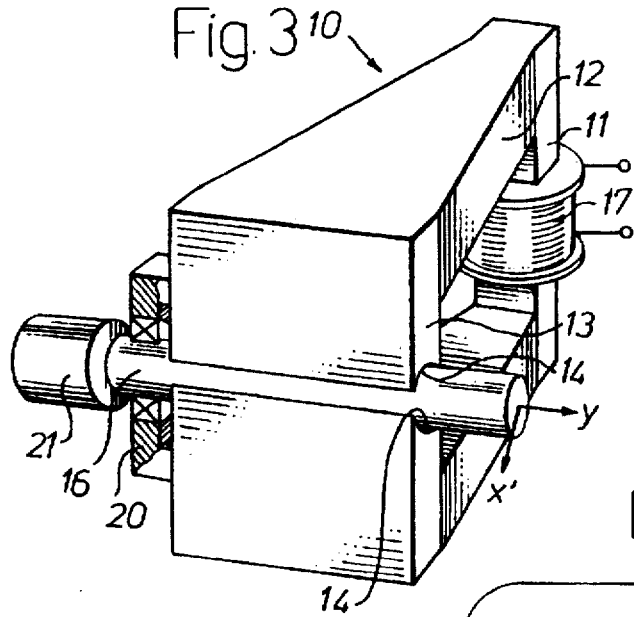
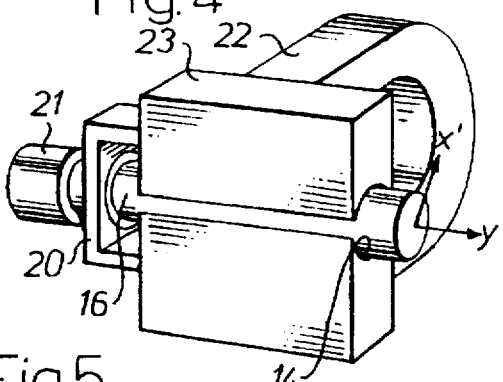
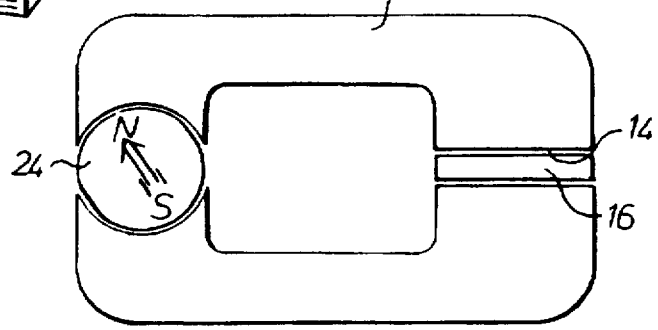

FORCE AND/OR MOTION GENERATING ARRANGEMENT

The present invention relates to a force and/or motion generating arrangement, comprising a body of magnetostrictive material, which may be utilized for applying a force on and/or imparting a motion to another object, and means for feeding a magnetic flux through said body in order to cause an elastic deformation thereof.

In practice, such arrangements are utilized for various different purposes. For instance, they are utilized as clamping arrangements or striking arrangements in which the magnetostrictive body may be caused to generate clamping forces or impact forces, respectively. Moreover, they are also used as micropositioning arrangements, in which case the magnetostrictive body is connected to a movable object to set the position of said object. Additionally, they are utilized as vibrating arrangements in which the magnetostrictive body serves to impart a vibrating motion to an object connected thereto. However, there exist also many other applications in addition to those above mentioned.

In the prior art, said body of magnetostrictive material has usually been formed as an elongate straight rod. Further, said means for feeding a magnetic flux through said body have usually been formed by an electric winding, consisting of a coil, which has been mounted on the rod extending round the same and which has been capable of generating a magnetic flux passing through the rod in the longitudinal direction thereof.

Due to the high reluctance of the closed path for the magnetic flux formed by the rod and the long air gap between the two ends of the rod, a comparatively high ampere-turn is required to generate a sufficiently high magnetic flux through the rod. This means that a relatively high current has to be fed through the coil and that the number of winding turns of the coil has to be comparatively large which, in its turn, results in that, during operation, the coil will be significantly heated. As a consequence of the high thermal coupling between the coil and the rod, said heating of the coil results in a significant heating of the rod as well, which will hereby experience a considerable thermally induced change in its length. This thermal change in the length of the rod often causes severe problems, which are especially troublesome in connection with an intermittent operation as any temperature balance will then never be reached. Apart from the problems occurring as a consequence of the thermally induced change in the length of the rod, the heating of the rod also causes additional problems following from the fact that the magnetostrictive properties of the rod are dependent on the temperature.

In order to overcome the above problems at least to some degree, in some cases, the coil has been provided with means for water-cooling the same. However, such a water-cooling involves considerable costs while simultaneously offering large practical difficulties, especially if the available space is restricted or if the arrangement in question should be movable. Naturally, as an alternative to a water-cooling of the coil, it is conceivable to utilize a direct water-cooling of the rod by feeding cooling water through one or more passages provided therein. However, in this case, apart from substantially the same disadvantages as in the case of water-cooling the coil, disadvantages will also occur as a consequence of the fact that the material in the rod may be corrodible and have a tendency to hydrogen embrittleness.

In GB-A 874 659, which not even hints at the problem above discussed, there is disclosed an arrangement which however may be said to represent a better solution of the problem of obtaining a reduction in the heating of an elongate body of magnetostrictive material which may be elastically deformed by feeding a magnetic flux therethrough. Said patent specification discloses an ultrasound generator in which a U-shaped yoke of soft magnetic material is utilized to feed a magnetic flux, produced by means of a winding mounted on said yoke, in the longitudinal direction through a body of magnetostrictive material, shaped as an elongate strip. By mounting the winding on a separate yoke instead of around the magnetostrictive body, a reduction is obtained in the reluctance of the magnetic circuit through which the magnetic flux generated by the winding passes. This means that the ampere-turn required for generating a magnetic flux of a certain desired magnitude as well as the development of heat in the winding thereby caused is reduced. Additionally, the thermal coupling between the winding and the magnetostrictive body is also reduced. Although both said circumstances result in a reduced heating of said body, the body will still have a substantial quantity of heat supplied thereto from the winding, namely on the one hand through radiation, and on the other hand through conduction via the yoke. The main reason for this is that the low permeability of the magnetostrictive material in the elongate strip-shaped body results in that said body will exhibit a comparatively high reluctance against the magnetic flux fed through the body in the longitidunal direction thereof, which means that a comparatively high ampere-turn will be required for generating a flux of sufficient magnitude.

Another disadvantage of the arrangement described in GB-A 874 659 is that the two ends of the magnetostrictive body are rigidly secured to the yoke and therefore prevented from moving in relation to each other in the longitudinal direction of said body. Accordingly, it is not possible to replace the magnetostrictive body, consisting of a thin strip which is deflectable at its central portion, by a stiff rod or other elongate body of magnetostrictive material which may apply a force on and/or impart a motion to another object by a mutual displacement of the two ends of the body in the longitudinal direction thereof caused by the magnetic flux. However, such an embodiment of the magnetostricitve body is often desirable, especially if the body should be capable of applying a comparatively high force on another object.

The invention has for its purpose to provide an improved force and/or motion generating arrangement of the kind initially specified, which makes it possible to obtain a further reduction in the heating of said body of magnetostrictive material occurring during the operation of the arrangement and which also makes it possible to design said body as an elongate stiff rod or other elongate body which, under the influence of the magnetic flux fed therethrough may undergo an elastic deformation involving a mutual displacement of the two ends of the body in the longitudinal direction thereof.

The arrangement according to the invention, proposed for said purpose, is primarily characterized in that said means comprise at least one pair of pole surfaces, which are located at a short distance from each other and which are facing each other, said pole surfaces being connected to at least one source of said magnetic flux and defining a gap for receiving said body therebetween and being arranged to feed the magnetic flux through said body in a first direction, in which said body has small dimensions in relation to its dimensions in at least one other direction, which is substantially perpendicular to said first direction and in which the body may be brought to apply said force on and/or impart said motion to said other object.

The invention is based on the understanding that the elastic deformation occurring in a body of magnetostrictive material as a consequence of a magnetic flux passing therethrough does not cause any substantial change in the volume of the body and that the change in the dimensions of the body in the direction in which the magnetic flux passes through the body therefore results in a simultaneous but opposite change in the dimensions of the body in directions perpendicular to the first mentioned direction.

In accordance with the invention, the magnetic flux may be fed through the magnetostrictive body in a direction in which said body exhibits a short length and a comparatively large area and hence a low reluctance, while simultaneously the change in the dimensions of the body in another direction, in which said body has a long length and a comparatively small area, caused by the magnetic flux, may be used for applying a force on and/or imparting a motion to another object. If, as is the case in a preferred embodiment of the invention, said pole surfaces are formed by opposite end surfaces of a yoke of soft magnetic material, on which an electric winding, serving as a source of the magnetic flux, is mounted, a significant reduction of the required ampere-turn is obtained and hence also a significant reduction of the heat generated in the winding as well as of the heating of the magnetostrictive body caused thereby. Moreover, the invention also results in that the yoke will not constitute any obstacle against a mutual displacement of the opposite end portions of the magnetostrictive body in said other direction.

Furthermore, the invention also offers a specific advantage consisting in that the magnetostrictive body may be given many other shapes than the shape of an elongate rod or the like, as the pole surfaces may easily be given a shape adapted to the desired shape of said body. For instance, the magnetostrictive body may have the shape of a circular disc or ring having a small thickness as compared to its diameter.

The invention also makes it possible, instead of or in addition to an electric winding, to use a permanent magnet as a source of the magnetic flux. If the arrangement comprises a permanent magnet as a source of the magnetic flux, the pole surfaces maybe formed by said permanent magnet itself and/or by members of soft magnetic material connected thereto.

When utilizing only a permanent magnet for generating the magnetic flux through the magnetostrictive body, the heating of said body previously discussed is completely eliminated.

Said body may suitably consist of an anisotropic magnetostrictive material. If the body is arranged to be received in a substantially stationary position in the gap defined by the pole surfaces, it should have its highest magnetostriction in said first direction, i.e. in the direction in which the magnetic flux is fed therethrough. If the body consists of a material having a positive magnetostriction, the pole surfaces may advantageously be arranged to apply a compressive prestress on said body in said first direction. By applying such a compressive prestress on the magnetostrictive body, it is possible to obtain an increased change in the dimensions thereof.

By way of example, it could be mentioned that one magnetostrictive material having a very high positive magnetostriction is Terfenol-D, which is an alloy of terbium, dysprosium and iron.

Special very favourable properties of the arrangement may be obtained if said body is formed by a straight rod of magnetostrictive material, which is received in said gap and which is mounted for rotation around its longitudinal axis and has its highest magnetostriction in a direction transversal to its longitudinal axis. By utilizing a magnetostrictive body consisting of such a rotatable rod, it is possible to generate the magnetic flux by means of a direct current fed through an electric winding and nevertheless to cause a periodic variation in the length of the rod by subjecting it to a rotary motion by means of an electric driving motor. Alternatively, if the magnetic flux is generated by means of an alternating current fed through a winding, the "length of the stroke" of the rod may be varied for instance by a manual adjustment of the rotary position of the rod. Additionally, it is also possible to feed an approximately constant magnetic flux, generated by a permanent magnet, through a rotatable magnetostrictive rod of the above kind and to cause a variation in the length of the rod by rotating the rod by means of a rotary motor or other operating means.

If, as previously mentioned, the arrangement comprises a permanent magnet, serving as a source of the magnetic flux, according to an alternative embodiment of the invention, said permanent magnet may be formed as a member, which is mounted for rotation around a longitudinal axis thereof and which is permanently magnetized in a direction transversal to said longitudinal axis and which is arranged to generate a magnetic flux through said body varying in dependence upon the rotary position of said member.

Below, the invention will be described in further detail with reference to the accompanying diagrammatic drawings, in which:

FIG. 1 shows a perspective view of a force and/or motion generating arrangement according to a first embodiment of the invention;

FIG. 2 shows a perspective view of an arrangement according to a second embodiment of the invention;

FIG. 3 shows a perspective view of an arrangement according to a third embodiment of the invention;

FIG. 4 shows a perspective view of an arrangement according to a fourth embodiment of the invention; and FIG. 5 shows a side elevation of an arrangement according to a fifth embodiment of the invention.

In FIG. 1, reference numeral 10 generally designates a yoke of soft magnetic material which is generally U-shaped, as seen in side elevation, and which comprises a central web portion 11 and two legs 12, extending in lateral directions from said web portion. At their free ends, legs 12 are provided with end portions 13, bent in directions towards each other and terminating into two elongate flat and mutually parallel pole surfaces 14, which are located at a short distance from each other and define a gap 15 therebetween. This gap serves to receive therein a body of magnetostrictive material, having the shape of an elongate straight rod 16 of rectangular cross-section.

On the web portion 11 of yoke 10 there is mounted an electric winding 17. When supplied with an electric current passing therethrough, said winding will generate a magnetic flux in the magnetic circuit formed by yoke 10 and rod 16. This magnetic flux will pass through rod 16 in a direction x, substantially perpendicular to the longitudinal direction y of the rod and substantially parallel to the perpendicular of pole surfaces 14. In dependence upon its magnitude, the magnetic flux will cause a variable change in the extension of rod 16 in the x-direction. This change in the extension of rod 16 in the x-direction results in a simultaneous but opposite change in the length of the rod in the y-direction. Since gap 15 as well as rod 16 may have a very long length in the y-direction as compared to its length in the x-direction, the change in the length of the rod in the y-direction may be brought to amount to a comparatively high value, although the change in the extension of the rod in the x-direction primarily caused by the magnetic flux may be comparatively small as a consequence of the short length of the rod in the latter direction. For this reason, rod 16 may suitably be utilized to apply a force on and/or impart a motion to another object in the y-direction. FIG. 1 diagrammatically indicates that rod 16 is rigidly secured to a mounting 18 at its one end, while, at its other end, it is arranged to co-operate with an object 19 on which it may have a force and/or motion producing influence depending on the magnetic flux.

Rod 16, which is arranged in a stationary position in gap 15, may advantageously be made of an anisotropic magnetostrictive material exhibiting its highest magnetostriction in the x-direction. For instance, it may be made of Terfenol-D, which is a material usually referred to as a giant magnetostrictive material due to its very high magnetostriction.

The arrangement according to FIG. 2 differs from the arrangement according to FIG. 1 mainly only in respect of the embodiment of yoke 10 which, according to FIG. 2, is formed as a circular cylindrical annular body which, at a selected portion along its circumference, is provided with an axially extending slot forming gap 15. In this case, yoke 10 may be laminated in a manner similar to the core of a transformer and consist of a plurality of thin elements 10' of soft magnetic material which are located in side-by-side positions and which are electrically insulated from each other.

If the yoke is laminated in the manner shown in FIG. 2 and rod 16 has a positive magnetostriction in the x-direction, yoke 10 may advantageously be utilized also to apply a compressive prestress on rod 16 in the x-direction via pole surfaces 14.

The embodiment according to FIG. 3 differs from the embodiment according to FIG. 1 mainly in that rod 16 has a circular cross-section and is rotatably mounted in a bearing arrangement 20 replacing mounting 18 in FIG. 1. Moreover, pole surfaces 14 have a curved arc-shaped profile matching the profile of the rod. Rod 16 consists of an anisotropic magnetostrictive material and has its highest magnetostriction in a direction x', transversal to the longitudinal axis y of the rod. Reference numeral 21 designates an electric driving motor by which the rod may be rotated around its longitudinal axis y.

Due to the abovementioned anisotropic magnetostrictive characteristics of rod 16, the elastic deformation of the rod, caused by a magnetic flux fed therethrough via pole surfaces 14, will vary in dependence upon the instantaneous rotary position of the rod. Accordingly, if a rotary motion is imparted to rod 16 by motor 21, while a mainly constant magnetic flux generated by a direct current passing through winding 17 is fed in a transversal direction through the rod, the length of rod 16 in the y-direction will be caused to vary in a periodic manner. Such a periodic variation in the length of rod 16 may be obtained also by subjecting the rod to the influence of a periodically varying magnetic flux, generated by an alternating current fed through winding 17. In this case, motor 21 may be replaced by a manual operating means by which rod 16 may be set in different rotary positions in order to adjust the amplitude of the abovementioned periodic variation in the length of the rod.

FIG. 4 shows an arrangement according to a fourth embodiment of the invention substantially corresponding to the arrangement according to FIG. 3, but differing therefrom in that winding 17 and yoke 10 have been replaced by a U-shaped permanent magnet 22 and pole pieces 23, mounted on the legs of said magnet and provided with facing pole surfaces 14, having an arc-shaped curved profile corresponding to the profile of the pole surfaces formed by yoke 10 in the embodiment according to FIG. 3. Even in this case, rod 16 is mounted for rotation around its longitudinal axis and it is connected to a motor 21, by which it may be rotated around said axis. Furthermore, as in the arrangement according to FIG. 3, it has anisotropic magnetostrictive characteristics and it has its highest magnetostriction in a direction x', transversal to the longitudinal axis y.

In the arrangement according to FIG. 4, permanent magnet 22 generates an approximately constant magnetic flux, which is fed through rod 16 in a direction transversal to the longitudinal direction of the rod. Accordingly, if a rotary motion is imparted to rod 16 by motor 21, the rod will be subjected to a periodic variation in its length as a consequence of the rotation of direction x' for its maximum magnetostriction relatively to the direction of the magnetic flux fed through the rod.

FIG. 5 shows a side elevation of an arrangement comprising a permanent magnet having the shape of an elongate rod 24 which is magnetized in a transversal direction and which may be rotated around its longitudinal axis in a manner not illustrated in greater detail. Reference numeral 25 designates two members of soft magnetic material which have generally U-shaped cross-sections and by means of which a magnetic flux, having a magnitude depending on the rotary position of permanent magnet rod 24, may be fed through a rod 16 of magnetostrictive material, having a generally rectangular cross-section and received in a gap defined between two plane pole surfaces 14 formed each by one member 25. In this case, the magnetostrictive rod 16 may exhibit its highest magnetostriction in a transversal direction, parallel to the perpendicular of the two pole surfaces 14. When rod 24 is rotated, it will generate a magnetic flux through the two elements 25 and rod 16, varying in dependence on the rotary position of rod 24. If rod 24 is rotated by means of a driving motor connected thereto but not shown, the length of rod 16 will be caused to vary in a periodic manner.

The invention is not restricted to the embodiments above described and shown in the drawings. Instead, many other embodiments are feasible within the scope of the invention. For instance, it could be mentioned that the body of magnetostrictive material and the pole surfaces serving to feed a magnetic flux through said body need not have an elongate rectilinear shape. Thus, said body and said surfaces may also have many other shapes. For instance, they may have a circular or annular shape. Moreover, it should be mentioned that the magnetostrictive body may be arranged to be received easily removable in the gap defined between the pole surfaces.

I claim:

1. A force and/or motion generating arrangement comprising:

a body of magnetostrictive material for applying a force on and/or imparting a motion to another object, means for feeding a magnetic flux through said body in order to cause an elastic deformation thereof, said means for feeding the magnetic flux comprising at least one pair of pole surfaces located at a short distance from each other and facing each other, and at least one source of said magnetic flux to which said pole surfaces are connected, said pole surfaces defining a gap for receiving said body therebetween and being arranged to feed the magnetic flux through said body in a first direction, in which said body has small dimensions in relation to its dimensions in at least one other direction which is substantially perpendicular to said first direction, the body applying said force on and/or imparting said motion to said other object in said at least one other direction.

2. An arrangement according to claim 1, wherein said pole surfaces are formed by opposite end surfaces of a yoke of soft magnetic material and said at least one source of said magnetic flux includes an electric winding mounted on said yoke.

3. An arrangement according to claim 1, wherein said at least one source of said magnetic flux comprises a permanent magnet.

4. An arrangement according to claim 3, wherein the pole surfaces are formed by said permanent magnet and/or by members of soft magnetic material connected thereto.

5. An arrangement according to claim 1, wherein said body consists of an anisotropic magnetostrictive material.

6. An arrangement according to claim 5, wherein said body is arranged to be received in a substantially stationary position in the gap defined by the pole surfaces and said body has its highest magnetostriction in said first direction.

7. An arrangement according to claim 6, wherein said body consists of a material having a positive magnetostriction and the pole surfaces are arranged to apply a compressive prestress on said body in said first direction.

8. An arrangement according to claim 5, wherein said body is a straight rod of said magnetostrictive material, is received in said gap, is mounted for rotation around its longitudinal axis and has its highest magnetostriction in a direction transversely oriented relative to its longitudinal axis.

9. An arrangement according to claim 3, wherein said permanent magnet is formed as a member which is mounted for rotation around a longitudinal axis thereof, is permanently magnetized in a direction transversely oriented relative to said longitudinal axis, and is arranged to generate a magnetic flux through said body which varies in dependence upon a rotary position of said member.

10. An arrangement according to claim 1, wherein said body is easily removable from said gap.

11. A force and/or motion generating arrangement comprising:

a body of magnetostrictive material for applying a force on and/or imparting a motion to another object, means for feeding a magnetic flux through said body in order to cause an elastic deformation thereof, said means for feeding the magnetic flux comprising at least one pair of pole surfaces located at a short distance from each other and facing each other, and at least one source of said magnetic flux to which said pole surfaces are connected, said pole surfaces defining a gap for receiving said body therebetween and being arranged to feed the magnetic flux through said body in a first direction, in which said body has small dimensions in relation to its dimensions in at least one other direction which is substantially perpendicular to said first direction, the body applying said force on and/or imparting said motion to said other object in said at least one other direction, wherein said pole surfaces are formed by opposite end surfaces of a yoke of soft magnetic material.

12. A force and/or motion generating arrangement comprising:

a body of magnetostrictive material for applying a force on and/or imparting a motion to another object, means for feeding a magnetic flux through said body in order to cause an elastic deformation thereof, said means for feeding the magnetic flux comprising at least one pair of pole surfaces located at a short distance from each other and facing each other, and at least one source of said magnetic flux to which said pole surfaces are connected, said pole surfaces defining a gap for receiving said body therebetween and being arranged to feed the magnetic flux through said body in a first direction, in which said body has small dimensions in relation to its dimensions in at least one other direction which is substantially perpendicular to said first direction, the body applying said force on and/or imparting said motion to said other object in said at least one other direction, wherein said at least one source of said magnetic flux includes an electric winding.

13. A force and/or motion generating arrangement comprising:

a body of magnetostrictive material for applying a force on and/or imparting a motion to another object, means for feeding a magnetic flux through said body in order to cause an elastic deformation thereof, said means for feeding the magnetic flux comprising at least one pair of pole surfaces located at a short distance from each other and facing each other, and at least one source of said magnetic flux to which said pole surfaces are connected, said pole surfaces defining a gap for receiving said body therebetween and being arranged to feed the magnetic flux through said body in a first direction, in which said body has small dimensions in relation to its dimensions in at least one other direction which is substantially perpendicular to said first direction, the body applying said force on and/or imparting said motion to said other object in said at least one other direction, wherein said at least one source of said magnetic flux comprises a permanent magnet and the pole surfaces are formed by said permanent magnet.

14. A force and/or motion generating arrangement comprising:

a body of magnetostrictive material for applying a force on and/or imparting a motion to another object, means for feeding a magnetic flux through said body in order to cause an elastic deformation thereof, said means for feeding the magnetic flux comprising at least one pair of pole surfaces located at a short distance from each other and facing each other, and at least one source of said magnetic flux to which said pole surfaces are connected, said pole surfaces defining a gap for receiving said body therebetween and being arranged to feed the magnetic flux through said body in a first direction, in which said body has small dimensions in relation to its dimensions in at least one other direction which is substantially perpendicular to said first direction, the body applying said force on and/or imparting said motion to said other object in said at least one other direction, wherein said at least one source of said magnetic flux comprises a permanent magnet and the pole surfaces are formed by members of soft magnetic material connected to said permanent magnet.

15. A force and/or motion generating arrangement comprising:
- a body of magnetostrictive material for applying a force on and/or imparting a motion to another object,
- means for feeding a magnetic flux through said body in order to cause an elastic deformation thereof,
- said means for feeding the magnetic flux comprising at least one pair of pole surfaces located at a short distance from each other and facing each other, and
- at least one source of said magnetic flux to which said pole surfaces are connected,
- said pole surfaces defining a gap for receiving said body therebetween and being arranged to feed the magnetic flux through said body in a first direction, in which said body has small dimensions in relation to its dimensions in at least one other direction which is substantially perpendicular to said first direction,
- the body applying said force on and/or imparting said motion to said other object in said at least one other direction,
- wherein said body consists of an anisotropic magnetostrictive material and said body is arranged to be received in a substantially stationary position in the gap defined by the pole surfaces.

16. A force and/or motion generating arrangement comprising:
- a body of magnetostrictive material for applying a force on and/or imparting a motion to another object,
- means for feeding a magnetic flux through said body in order to cause an elastic deformation thereof,
- said means for feeding the magnetic flux comprising at least one pair of pole surfaces located at a short distance from each other and facing each other, and
- at least one source of said magnetic flux to which said pole surfaces are connected,
- said pole surfaces defining a gap for receiving said body therebetween and being arranged to feed the magnetic flux through said body in a first direction, in which said body has small dimensions in relation to its dimensions in at least one other direction which is substantially perpendicular to said first direction,
- the body applying said force on and/or imparting said motion to said other object in said at least one other direction,
- wherein said body consists of an anisotropic magnetostrictive material and said body has its highest magnetostriction in said first direction.

17. A force and/or motion generating arrangement comprising:
- a body of magnetostrictive material for applying a force on and/or imparting a motion to another object,
- means for feeding a magnetic flux through said body in order to cause an elastic deformation thereof,
- said means for feeding the magnetic flux comprising at least one pair of pole surfaces located at a short distance from each other and facing each other, and
- at least one source of said magnetic flux to which said pole surfaces are connected,
- said pole surfaces defining a gap for receiving said body therebetween and being arranged to feed the magnetic flux through said body in a first direction, in which said body has small dimensions in relation to its dimensions in at least one other direction which is substantially perpendicular to said first direction,
- the body applying said force on and/or imparting said motion to said other object in said at least one other direction,
- wherein said body consists of an anisotropic magnetostrictive material and said body is a straight rod of said magnetostrictive material and is received in said gap.

* * * * *